United States Patent [19]
Morris

[11] Patent Number: 5,411,723
[45] Date of Patent: May 2, 1995

[54] PROCESS FOR REDUCING THE DAMAGE SUSCEPTIBILITY IN OPTICAL QUALITY CRYSTALS

[75] Inventor: Patricia A. Morris, Wilmington, Del.

[73] Assignee: E. I. Du Pont de Nemours and Company, Wilmington, Del.

[21] Appl. No.: 123,662

[22] Filed: Sep. 22, 1993

Related U.S. Application Data

[63] Continuation of Ser. No. 860,862, Mar. 31, 1992, abandoned.

[51] Int. Cl.$^6$ .................... C01B 25/26; C01G 28/02; C30B 31/00
[52] U.S. Cl. .................... 423/306; 423/602; 117/2; 117/941; 117/944; 117/71
[58] Field of Search .................... 423/593, 602, 306; 156/623 R, DIG. 71, DIG. 75, DIG. 81; 385/129; 359/350; 264/2.6, 345; 372/34; 117/71, 941, 944, 2

[56] References Cited

U.S. PATENT DOCUMENTS

| | | | |
|---|---|---|---|
| 3,949,323 | 4/1976 | Bierlein et al. | 332/7.51 |
| 4,231,838 | 11/1980 | Gier | 156/600 |
| 4,640,736 | 2/1987 | Holman | 156/DIG. 71 |
| 4,761,202 | 8/1988 | Bordui et al. | 156/621 |

(List continued on next page.)

FOREIGN PATENT DOCUMENTS

WO88/04882 7/1988 WIPO .

OTHER PUBLICATIONS

Terashima, K. et al., Japanese Journal of Applied Physics, vol. 30, No. 3B, Mar. 1991, Tokyo, Japan, pp. L497–L499.
Lemeshko, V. V. et al, Ukr. Fiz. Zh. Russ. Ed. 31, No. 11, 1745–50, 1986.
Morris, P. A. et al, SPIE, The International Society for Optical Engineering, vol. 1561, Inorganic Crystals for Optics, Electro-Optics, and Frequency Conversion, 104–110, 1991.
Bordui, P. F. et al, Ferroelectrics, 115, 7–12, 1991.
Morris, P. A. et al, Mat. Res. Soc. Symp. Proc., vol. 152, pp. 95–101, 1989.
Morris, P. A. et al, Mat. Res. Soc. Symp. Proc., vol. 172, pp. 283–289, 1990.
Roelofs, M. G., J. Appl. Phys., 65(12), 4976–4982, 1989.
Ahmed, F., Applied Optics, 28(1), 119–122, 1989.
Jacco, J. C. et al, Optics Lett., 16(17), 1307–1309, 1991.
Bierlein, J. D. et al, J. Opt. Soc. Am., B/6(4), 622–633, 1989.
V. V. Lemeshko et al., Ukr. Fiz. Zh. Russ. Ed. 31, No.
(List continued on next page.)

Primary Examiner—Steven Bos

[57] ABSTRACT

A process is disclosed for treating a crystal of MTiOXO$_4$ which has crystal structure deficiencies of M and O, wherein M is selected from the group consisting of K, Rb, Tl and NH$_4$ and mixtures thereof and X is selected from the group consisting of P, As and mixtures thereof, which includes the step of heating said crystal in the presence of a mixture of MTiOXO$_4$ and at least one inorganic compound of one or more monovalent cations selected from the group consisting of Rb+, K+, Cs+ and Ti+ (said inorganic compound(s) being selected to provide a source of vapor phase monovalent cation and being present in an amount sufficient to provide at least a 0.1 mole % excess of the monovalent cation in relation to the M in the MTiOXO$_4$ in said mixture) at a temperature of from about 400° C. to 950° C. and a pressure of at least 14 psi, and in the presence of a gaseous source of oxygen for a time sufficient to decrease the optical damage susceptibility of said crystal.

9 Claims, 1 Drawing Sheet

U.S. PATENT DOCUMENTS 5,015,328 5/1991 Fitzpatrick et al. ............... 156/624
5,066,356 11/1991 Ferretti et al. .................... 156/624
5,084,206 1/1992 Ballman et al. .................... 252/301

OTHER PUBLICATIONS

11:1745–50 (1986) "The Electrochromic Effect in Potassium Titanate–Phosphate Crystals".

J. C. Jacco, Optic Letters, vol. 16, No. 17, 1307–1309 (1991) "Bulk–darkening threshold of flux-grown $KTiOPO_4$".

P. A. Morris et al., Inorganic Crystals for Optics, Electro–Optics, and Frequency Conversion, 104–110 (1991).

J. D. Bierlein et al., J. Opt. Soc. Am. B/vol. 6, No. 4, 622–633 (1989) "Potassium titanylphosphate: properties and new applications".

F. Ahmed, Applied Optics, vol. 28, No. 1, 119–122 (1989) "Laser damage threshold of $KTiOPO_4$".

P. A. Morris et al., Mat. Res. Soc. Symp. Proc., vol. 172, 283–289 (1990) "Proton Effects in $KTiOPO_4$".

P. A. Morris et al., Mat. Res. Soc. Symp. Proc., vol. 152, 95–101 (1989) "Defects in $KTiOPO_4$".

P. F. Bordui et al., Ferroelectrics, vol. 115, 7–12 (1991) "Curie Temperature Measurements on $KTiOPO_4$ Single Crystals Grown by Flux and Hydrothermal Techniques".

M. G. Roelofs, J. Appl. Phys. 65 (12), 4976–4982 (1989) "Identification of $Ti^{3+}$ in Potassium titanylphosphate and its possible role in laser damage"n.

PROCESS FOR REDUCING THE DAMAGE SUSCEPTIBILITY IN OPTICAL QUALITY CRYSTALS

This is a continuation of application Ser. No. 07/860,862, filed Mar. 31, 1992, now abandoned.

FIELD OF THE INVENTION

This invention relates to a process for reducing the damage susceptibility of optically useful crystals of $KTiOPO_4$ and certain of its analogs.

BACKGROUND

Crystals of $KTiOPO_4$ and its analogs are considered highly useful because of their nonlinear optical properties. U.S. Pat. No. 3,949,323 teaches the use of crystals in nonlinear optical devices. Since $KTiOPO_4$ and its analogs are known to decompose upon melting, hydrothermal or flux methods have commonly been used to grow crystals of these compounds. U.S. Pat. No. 3,949,323, as well as others teach preparation of the crystals by hydrothermal methods. Indeed, despite the requirement for high pressures (on the order of hundreds of atmospheres), high temperatures, and relatively long crystal growth times, the art has generally conveyed a preference for hydrothermal methods of crystal growth.

A desire for larger crystal size, better quality and greater durability, i.e., lower susceptibility to damage, as well as the disadvantages of hydrothermal processes have led to continued interest in flux growth techniques and to the development of a variety of flux processes. In U.S. Pat. No. 4,231,838 crystal growth is carried out by heating certain mixtures of $MTiOXO4$ with a nonaqueous flux M/X/O (where M is selected from K, Tl, and Rb and X is selected from P and As) or their precursors to produce a nonaqueous melt. More recently, U.S. Pat. No. 5,084,206 discloses a flux method using selected dopants to produce crystals having lowered ionic conductivity, a feature desired for many applications.

While the crystals produced by the known flux processes can have high optical quality, the rigors of certain optical applications, require high resistance to optical damage or lower susceptibility to optical damage than exhibited by most flux produced crystals, i.e., 10 $GW/cm^2$. For example, in uses where the crystal is subjected to high electric fields or high power laser radiation, a typical flux crystal can develop "grey tracks" or even significantly darken throughout the crystal severely limiting the continued use of the crystal. Such damage is discussed, for example, in V. V. Lemeshko et al., Ukr. Fiz. Zh. Russ. Ed 31, No. 11:1745–50 (1986); P. A. Morris et al., SPIE, The International Society for Optical Engineering, Vol. 1561, Inorganic Crystals for Optics, Electro-Optics, and Frequency Conversion, 104–110 (1991); and J. C. Jacco et al., Optics Letters, Vol. 16 (7), 1307-1309 (1991).

SUMMARY OF THE INVENTION

A process is provided in accordance with this invention for treating a crystal of $MTiOXO_4$ which has crystal structure deficiencies of M and O, wherein M is selected from the group consisting of K, Rb, Tl and $NH_4$ and mixtures thereof and X is selected from the group consisting of P and As and mixtures thereof. The process comprises the step of heating the crystal in the presence of a mixture of $MTiOXO_4$ (e.g., a powder) and at least one inorganic compound of one or more monovalent cations selected from the group consisting of $Rb^+$ $K^+$ $Cs^+$ and $Tl^+$, at a treatment temperature of from about 400° C. to 950° C. and a pressure of at least 14 psi, and in the presence of a gaseous source of oxygen for a time sufficient to decrease the optical damage susceptibility of the crystal. The inorganic compound should be present in an amount sufficient to provide excess of the monovalent cation, in relation to the amount of the monovalent cation, M, in the $MTiOXO_4$ in said mixture and should be selected to provide a source of vapor phase monovalent cation at the treatment temperature. This process is considered particularly useful for treating flux grown crystals.

DETAILED DESCRIPTION

Figure 1:
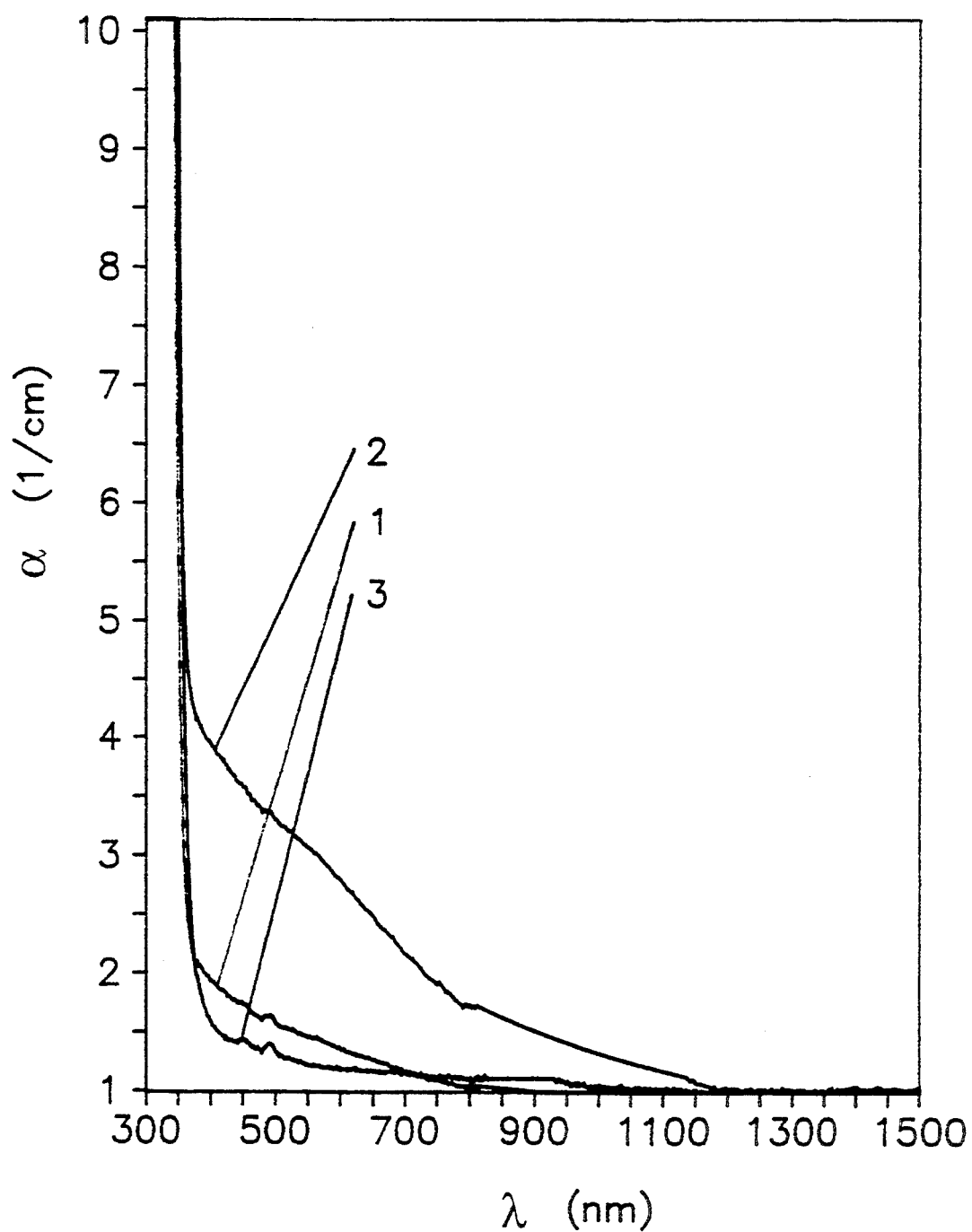
FIG. 1 is a plot of the absorption coefficient, $\alpha$, versus the wavelength of incident radiation, $\lambda$, for crystals described in Example 1.

This invention involves the discovery that crystals of $MTiOXO_4$ (including flux grown and hydrothermally grown crystals wherein M is K, Rb, Tl and/or $NH_4$ and X is As and/or P) do not have perfect stoichiometry. Specifically, it has been found that such crystals of $MTiOXO_4$, particularly when flux grown, have vacant M and vacant O sites in the crystal lattice. While this invention is not bound by any theory or explanation of operation, it is believed to be those imperfections that cause the susceptibility optical damage, especially when the crystal is flux grown. Optical damage in such crystals can be electric field-induced and/or optical radiation-induced (e.g., laser-induced).

The process of this invention treats crystals of $MTiOXO_4$ which have crystal structure deficiencies of M and O by heating them in the presence of a mixture of $MTiOXO_4$ and at least one inorganic compound of $Rb^+ K^+$, $Cs^+$ and/or $Tl^+$ at a treatment temperature of from about 400° C. to 950° C. and a pressure of at least 14 psi and in the presence of a gaseous source of oxygen for a time sufficient to decrease the optical damage susceptibility of the crystal. The inorganic compound is selected to provide a source of vapor phase $Rb^+$, $K^+$, $Cs^+$ and/or $Tl^+$ at the treatment temperature and is present in an amount sufficient to provide at least 0.1 mole %, preferably at least about 5 mole %, and most preferably at least about 10 mole %, excess of $Rb^+$, $K^+$, $Cs^+$ and/or $Tl^+$ in relation to the M in the $MTiOXO_4$ in the mixture. The inorganic compound containing a monovalent cation useful in the practice of this invention is preferably an inorganic oxygen containing compound (e.g., an oxide, sulfate, carbonate, nitrate or hydroxide) of at least one monovalent cation selected from the group consisting of $Rb^+$, $K^+$, $Cs^+$ and $Tl^+$ (e.g., $K_2SO_4$ and $K_2CO_3$). For availability, handling and economics it is preferred that the inorganic compound be in a powdered or particulate form. The $MTiOXO_4$ in the mixture is also preferably in the form of a powder or particulate.

The crystal of $MTiOXO_4$ to be treated need only be in proximity to the mixture, so long as means are provided for vapor transport of the monovalent cation and oxygen. It is believed that the monovalent cation(s) from the mixture and the O ions from the gaseous source of oxygen (and optionally, the mixture) vaporize and diffuse into the structure of the crystal of $MTiOXO_4$. The crystal can conveniently be placed in proximity to the source of oxide by first being placed in a container, such as a metal crucible, which is then placed on the source of oxide or can be placed in direct contact with the source of oxide. It is preferred that the crystal of $MTiOXO_4$ be placed in a container, such as a platinum dish or pan, capable of standing the operation temperatures, on top of the particulate source of oxide. The heating process is then conveniently conducted inside a reaction vessel capable of standing pressures of at least 14 psi, typically at least 100 psi and, more typically at least 200 psi.

The source of gaseous oxygen can conveniently be pure $O_2$ or air at a pressure of at least 14 psi. Typically pure oxygen is used at a pressure of at least 100 psi and, more typically at least 200 psi. The crystal is heated to a temperature of at least about 400° C., preferably at least about 600° C., and most preferably at least about 700° C. Generally, the treatment temperature is less than about 950° C. and is preferably less than about 850° C.

While hydrothermally grown crystals may be treated by this method, the treatment is considered particularly useful for treating flux grown crystals. All flux grown crystal compositions of the formula $MTiOXO_4$ can benefit from treatment in accordance with the invention. Crystal compositions of potassium titanyl phosphate (i.e., $KTiOPO_4$) are preferred. Typical flux crystals are grown by preparing a substantially isothermal melt containing the components for forming $MTiOXO_4$ crystals and a flux comprising oxides of M and X; suspending a seed crystal of $MTiOXO_4$ in the melt; slowly decreasing the temperature of the melt while maintaining substantially isothermal conditions therein; and continuing decreasing the temperature until crystallization of the crystalline composition is completed. The components for forming $MTiOXO_4$ crystals are well known in the art (see, for example, U.S. Pat. No. 4,231,838 and U.S. Pat. No. 4,761,202, which are hereby incorporated by reference); and include oxides of Ti, M and X, the precursors of the oxides of Ti, M and X, and materials composed of mixtures of the oxides and/or precursors of the oxides of Ti, M and X. In accordance with this invention seed crystals of $MTiOXO_4$, as defined above, can be utilized.

At a given temperature and pressure, the heating time is determined by the size of the crystal and the depth to which one wishes to treat the crystal. If it is desired to treat only the surface or surfaces of the crystal, the crystal can be heated for as little as a second to a few days. If it is desired to treat the crystal to a greater depth, the crystal is typically heated for at least a week to as long as several weeks. Longer heating times may allow for further treatment and will not generally harm the crystal, even if unnecessary for the desired degree of reduction in damage susceptibility.

To avoid thermal shock to the crystal of $MTiOXO_4$ it is preferred that the crystal and source of oxide be heated slowly to around the treatment temperature.

Susceptibility of crystals to optical damage from exposure to an electric field is believed to generally correlate with susceptibility to optical damage from exposure to optical laser radiation.

The crystals treated in accordance with this invention have utility for frequency generation (e.g., SHG) and electro-optic applications.

Practice of the invention will become further apparent from the following non-limiting example.

EXAMPLE I

Two samples (about $5\times5\times1$ mm) were cut from a single z-cut wafer of a crystal of $KTiOPO_4$, flux grown using a $K_6P_4O_{13}$ flux as described in U.S. Pat. No. 4,231,838, and polished. One of the samples was placed in a platinum pan and put on top of about 10 grams of powdered mixture consisting of $KTiOPO_4$ and 0.035 grams of $K_2CO_3$ per each gram of $KTiOPO_4$ powder (about a 10 mole % excess K based on the molar amount of K in the $KTiOPO_4$ powder). This combination was placed in a covered platinum crucible and heated at 725° C. for about 21 days under $O_2$ at a pressure greater than 200 psi. The treated sample and the second "as-grown", untreated, sample were then damaged by being subjected to an electric field of 300 V/cm in dry air at 200° C. for 20 minutes. The optical absorption spectra (absorption coefficient, $\alpha$, versus wavelength, $\lambda$) of the damaged treated sample (1) and the damaged "as-grown" sample (2) were obtained and are shown in FIG. 1, along with an "as-grown" or untreated sample which was not subjected to the electric field (3) for reference. The data of FIG. 1 clearly show the reduction in damage susceptibility for the treated $KTiOPO_4$.

The example serves to illustrate a particular embodiment of the invention. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A process for treating a grown crystal of $MTiOXO_4$ which has crystal structure deficiencies of M and O, wherein M is selected from the group consisting of K, Rb, Tl, $NH_4$ and mixtures thereof and X is selected from the group consisting of P, As and mixtures thereof, comprising:

placing said crystal in a container in the presence of proximity to a mixture of $MTiOXO_4$ wherein M is selected from the group consisting of K, Rb, Tl, $NH_4$ and mixtures thereof and X is selected from the group consisting of P, As and mixtures thereof and at least one inorganic compound of one or more monovalent cations selected from the group consisting of $Rb^+$, $K^+$, $Cs^+$ and $Tl^+$ for vapor transport of the one or more monovalent cations from the mixture to the crystal at a treatment temperature of from about 400° C. to 950° C., and a treatment pressure of at least 100 psi, and heating in the presence of a gaseous source of oxygen at said treatment temperature and said treatment pressure for a time sufficient for the vapor transport of the one or more monovalent cations from the mixture to the crystal and for the vapor transport of oxygen to the crystal to decrease the optical damage susceptibility of said crystal relative to its optical damage susceptibility prior to treatment;

wherein said inorganic compound is present in an amount sufficient to provide at least a 0.1 mole % excess of the monovalent cation in relation to the M in the $MTiOXO_4$ in said mixture and is selected to provide a source of vapor phase monovalent cation at the treatment temperature.

2. The process of claim 1 wherein the crystal is flux grown.

3. The process of claim 1 or claim 2 wherein the grown crystal of $MTiOXO_4$ is $KTiOXO_4$ and the $MTiOXO_4$ in said mixture is $KTiOXO_4$.

4. The process of claim 3 wherein the inorganic compound is $K_2CO_3$.

5. The process of claim 1 or claim 2 wherein the inorganic compound contains oxygen.

6. The process of claim 5 wherein the inorganic compound is $K_2CO_3$ or $K_2SO_4$.

7. The process of claim 1 or claim 2 wherein the inorganic compound and the $MTiOXO_4$ in the mixture are in powdered form.

8. The process of claim 1 or claim 2 where the inorganic compound is present in an amount sufficient to provide at least about 5 mole % excess of the monovalent cation in relation to the M in the $MTiOXO_4$ in said mixture.

9. The process of claim 1 or claim 2 wherein the gaseous source of oxygen is $O_2$ at a pressure of at least 200 psi.

* * * * *